(12) United States Patent
Noble

(10) Patent No.: US 6,359,783 B1
(45) Date of Patent: Mar. 19, 2002

(54) INTEGRATED CIRCUIT SOCKET HAVING A BUILT-IN VOLTAGE REGULATOR

(75) Inventor: Scott L. Noble, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,118

(22) Filed: Dec. 29, 1999

(51) Int. Cl.[7] ................................................. H05K 7/20
(52) U.S. Cl. ...................... 361/704; 307/150; 361/690; 361/785; 439/620; 439/487
(58) Field of Search .......................... 307/150; 324/755; 363/141; 361/704, 707, 690, 767, 785, 792, 809–811; 439/71, 76.1, 76.2, 620, 638–639, 485, 487, 924.1

(56) References Cited

U.S. PATENT DOCUMENTS 5,170,067 A * 12/1992 Baum et al. ................. 439/620
5,694,297 A * 12/1997 Smith et al. ................. 361/704
5,984,728 A * 11/1999 Chen et al. .................. 439/620

* cited by examiner

Primary Examiner—Gregory Thompson
(74) Attorney, Agent, or Firm—Blakely, Sokoloff, Taylor & Zafman LLP

(57) ABSTRACT

A socket attaches to a first component and includes a receptive area to couple a second component to the first component. A low profile voltage regulator is integrated into the socket and proximately disposed adjacent to the receptive area. The low profile voltage regulator converts a first power signal from the first component to a second power signal for the second component. A chassis encloses the socket and the low profile voltage regulator and serves as a base for a heat sink to be attached to the second component.

16 Claims, 5 Drawing Sheets

INTEGRATED CIRCUIT SOCKET HAVING A BUILT-IN VOLTAGE REGULATOR

FIELD OF THE INVENTION

The present invention pertains to the field of integrated circuits. More particularly, the present invention relates to regulating power supplied to an integrated circuit inserted in a socket.

BACKGROUND INFORMATION

Advances in integrated circuit technology continue to provide faster, more robust, and more densely packed integrated circuits. With each technological advance, power delivery, input/output, and thermal solutions become more problematic. FIG. 1 illustrates part of a computer system having power delivery, input/output, and thermal solutions common in the prior art.

In FIG. 1, system board 110 is a printed circuit board to which various other components are attached. Transformer 123 and capacitors 127 of voltage regulator 120 are soldered to system board 110. Central processing unit (CPU) 130 is coupled to system board 110 through socket 140. Heat sink 150 is thermally coupled to CPU 130.

Socket 140 provides the input/output solution for CPU 130. A number of leads 145 connect the various input/output ports (not shown) on CPU 130 to various buses, control lines, and power lines (not shown) on system board 110. Each lead 145 has associated with it a certain amount of inductance. Inductance is related to the length of the leads and must be below a certain critical inductance level in order for input and output operations to work properly. The critical inductance decreases as the operating frequency of CPU 130 increases. In which case, the maximum allowable length of leads 145 tends to decrease as operating frequency increases.

Voltage regulator 120 provides the power delivery solution for CPU 130. CPUs usually operate at different voltage levels and tolerance levels than are typically provided by most power supplies used in computer systems. For instance, a CPU may operate at 1.2 volts DC with a tolerance of plus or minus 0.01 volts. A power supply may provide 5 volts DC with a tolerance of plus or minus 0.25 volts. Another type of power supply may provide a high frequency AC voltage. In either case, in FIG. 1, voltage regulator 120 receives power from the power supply (not shown), and converts the power to a voltage level and tolerance level required by CPU 130.

CPUs also commonly consume power at a higher rate than most power supplies provide. The amount of power that a CPU consumes depends on clock speed (operating frequency) and transistor density. For each clock period, hundreds of thousand, if not millions, of transistors draw current simultaneously. The current is drawn in bursts corresponding to the clock periods. The change in current with respect to time (i.e. the slew rate) for each clock period is likely to be faster than a typical power supply can handle. In which case, in FIG. 1, voltage regulator 120 not only converts power to appropriate voltage and tolerance levels, but also supplies power at the required slew rate. Capacitors 127 store power from the power supply so that it can be provided at the faster slew rate. The amount of capacitance needed to sustain the slew rate for CPU 130 increases as the slew rate increases and increases as the distance between capacitors 127 and CPU 130 increases. Larger capacitance generally means larger and/or more capacitors are needed.

Heat sink 150 provides the thermal solution for CPU 130. Heat sink 150 is situated in close proximity to CPU 130 so that the heat sink can absorb and dissipate the heat generated by the CPU. If the operating speed and/or transistor density of CPU 130 is increased, CPU 130 will generate more heat. The more heat that CPU 130 generates, the more surface area heat sink 150 needs to dissipate heat (assuming all other factors are equal).

Putting the input/output, power, and thermal solutions together causes a variety of design conflicts. Voltage regulator 120 needs to be as close as possible to CPU 130 to provide power at the required slew rate in an efficient manner. Heat sink 150 must also be close to CPU 150 and also requires a certain surface area to absorb and dissipate the CPU's heat. As shown in the illustrated embodiment, the size of heat sink 150 limits how close voltage regulator 120 can be to the CPU. If socket 140 were taller, voltage regulator 120 could fit under the heat sink and get closer to CPU 130. But, the height of socket 140 is limited by the critical inductance of leads 145 and the need for heat sink 150 to be in contact with CPU 130.

As technology allows CPU 130 to run faster and include more transistors, the design conflicts among the three solutions get worse. The components of voltage regulator 120 get larger, heat sink 150 gets larger, and socket 140 gets shorter. In fact, as power requirements increase, voltage regulator 120 generates so much heat that it needs its own thermal solution, adding complexity and cost to the design. For instance, a typical thermal solution for voltage regulator 120 may includes an additional fan (not shown) which occupies valuable space on system board 110 and requires additional power.

SUMMARY OF THE INVENTION

A socket attaches to a first component and includes a receptive area to couple a second component to the first component. A low profile voltage regulator is integrated into the socket and proximately disposed adjacent to the receptive area. The low profile voltage regulator converts a first power signal from the first component to a second power signal for the second component. A chassis encloses the socket and the low profile voltage regulator and serves as a base for a heat sink to be attached to the second component.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

The present invention integrates compact, high power voltage regulator components into the form factor of a socket. Integrating the voltage regulator into a socket allows the regulator to be closer to the target load and more efficiently supply power. In various embodiments, as discussed below, integrating the voltage regulator into the socket also simplifies thermal solutions and input/output solutions. In general, the present invention alters the form factor of prior art sockets, such as socket 140 of FIG. 1. The form factor retains the requisite low profile to meet the critical inductance requirements for the socketed component (such as CPU 130 of FIG. 1), but with additional space to accommodate the voltage regulator and leave room for the thermal solution (such as heat sink 150 of FIG. 1).

Figure 2:
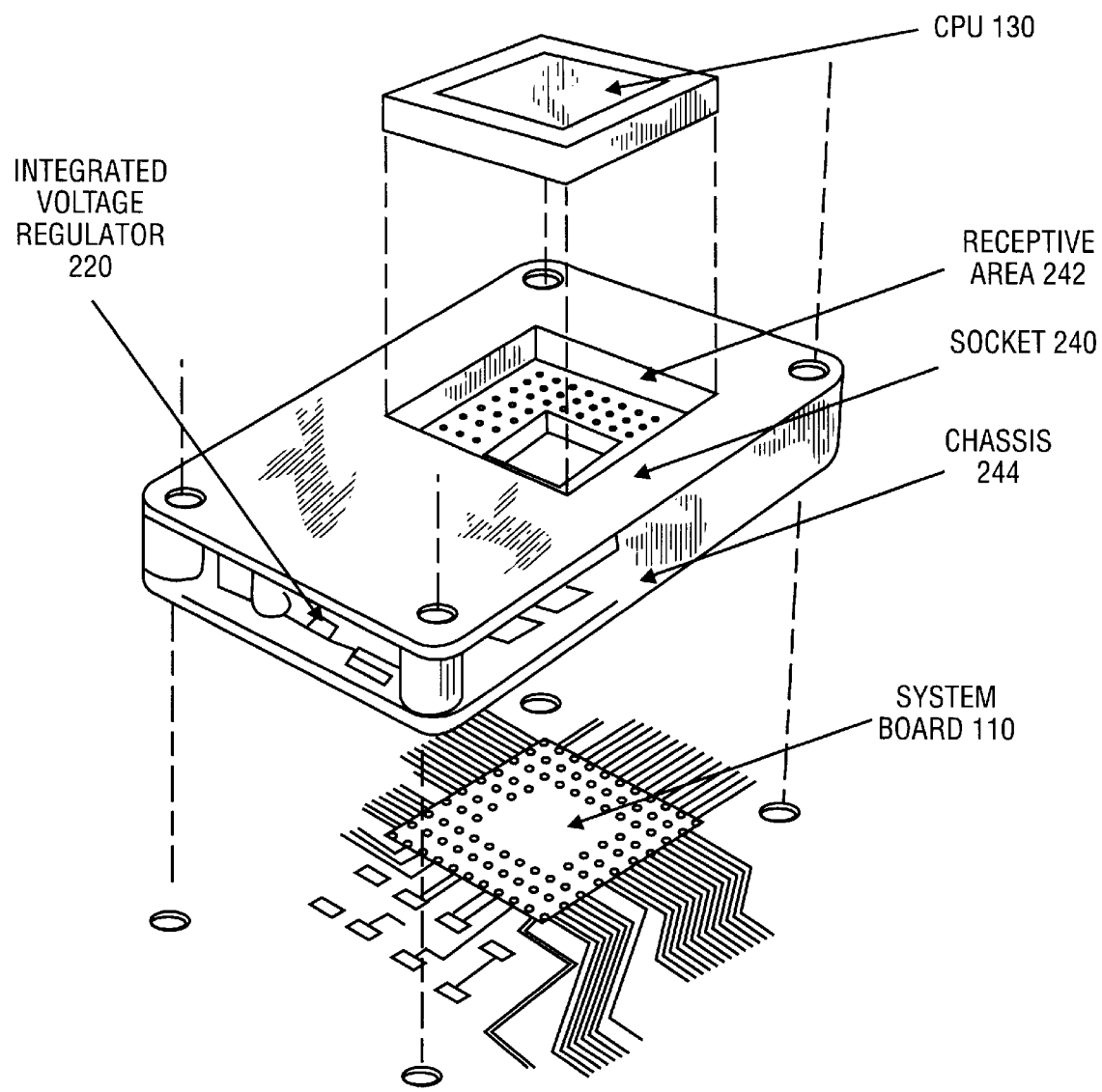
FIG. 2 illustrates one embodiment of the present invention.

FIG. 2 illustrates one embodiment of the present invention. Central processing unit (CPU) 130 inserts into socket 240 in receptive area 242. Socket 240 provides the input/output (I/O) solution between CPU 130 and system board 110. In the illustrated embodiment, socket 240 has a cutaway in its chassis 244 to reveal where voltage regulator 220 is integrated into the socket. Voltage regulator 220 provides the power solution for CPU 130. Voltage regulator 220 is comprised of compact components that provide power at the relatively large rate required by CPU 130, and yet the components fit within the limited height of socket 240.

By integrating voltage regulator 220 into socket 240, voltage regulator 220 can be positioned as close as possible to CPU 130 without actually being integrated into CPU 130. In comparison to the prior art system of FIG. 1, capacitors 127 are bulk capacitors. The form factor for capacitors 127 are typically on the order of 0.5 inches tall and 0.25 inches in diameter. Socket 140 is typically on the order of 0.2 to 0.25 inches tall. In which case, bulk capacitors 127 cannot get any closer to CPU 130 in FIG. 1 than the perimeter of socket 140 because the capacitors cannot fit within the form factor of the socket.

The amount of capacitance needed to power CPU 130 increases the farther away the capacitors are located. In the present invention, as illustrated in FIG. 2, the compact components of regulator 220 can be positioned very close the CPU 130. In which case, regulator 220 provides power more efficiently and does not need as much capacitance as regulator 120 to provide the same rate of power. Socket 240 also has the same height requirements as socket 140. In which case, the components of voltage regulator 220 must be able to fit in a form factor having a height on the order of 0.2 to 0.25 inches.

Figure 3:
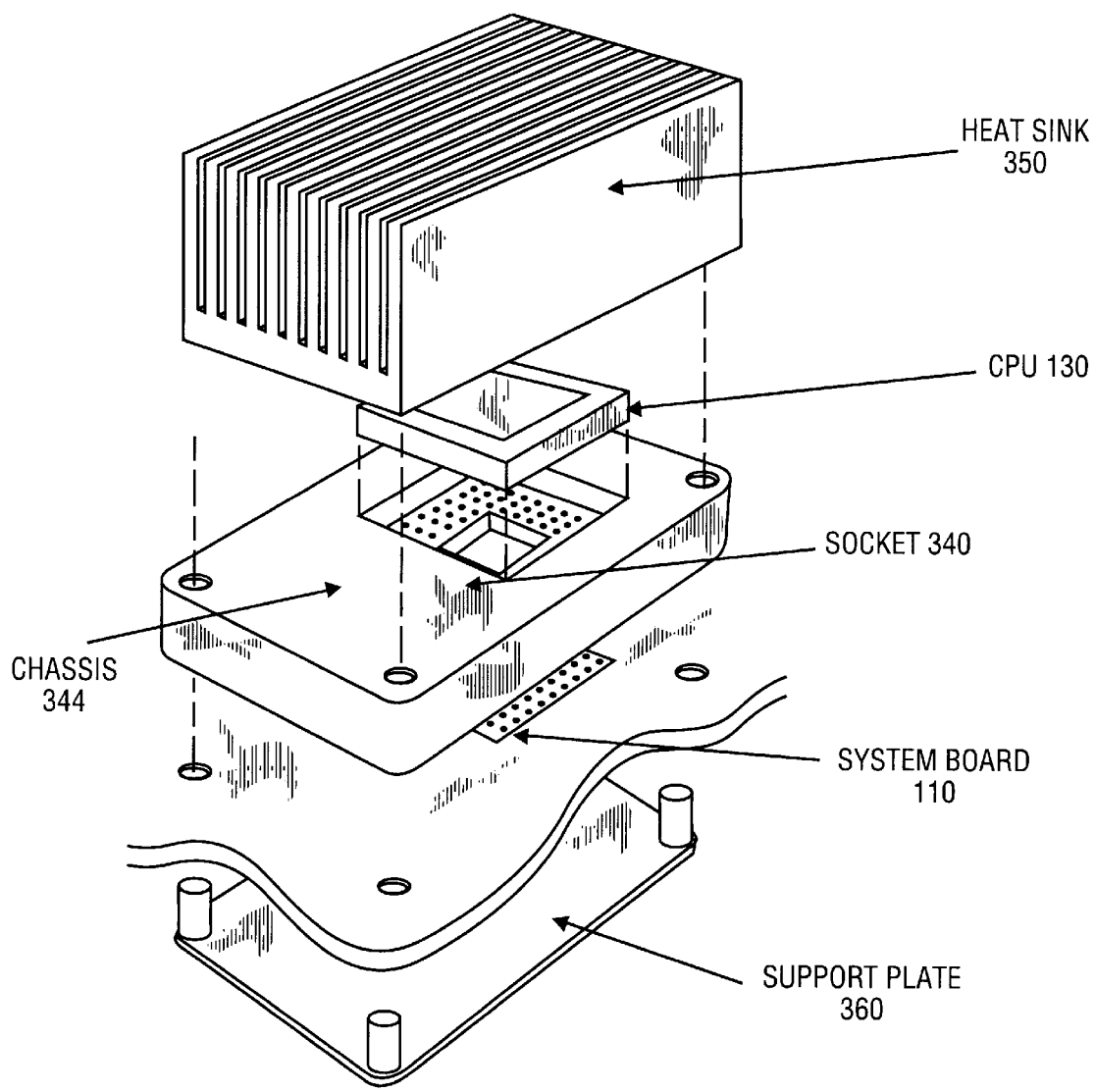
FIG. 3 illustrates another embodiment of the present invention.

FIG. 3 illustrates another embodiment the present invention including a thermal solution and a support structure for the thermal solution. Support plate 360 mounts to the bottom of system board 110 to provide additional structural integrity to support the bulk of heat sink 350 coupled to the top of socket 340. Chassis 344 of socket 340 serves as a base for heat sink 350. Heat sink 350, like heat sink 150 in FIG. 1, makes contact with CPU 130 to absorb and dissipate heat from the CPU. In which case, the height of socket 340 is limited not only by the inductance of leads (not shown) within socket 340, but also by the requirement that heat sink 350 be close enough to CPU 130 to absorb heat. That is, in the illustrated embodiment, the height of socket 340 is limited by the maximum length of the leads and the height of CPU 130 such that the top of socket 340 is at most flush with the top of CPU 130 to provide heat sink 350 with a direct thermal connection to the CPU.

Socket 340 is virtually identical to socket 240 from FIG. 2 with the exception of the cutaway that reveals the integrated voltage regulator. The voltage regulator (not shown) integrated in socket 340 can generate a great deal of heat. As discussed above, prior art voltage regulators often include their own thermal solutions such as an extra fan. In the present invention however, as illustrated in FIG. 3, the voltage regulator fits within socket 340 so it can take advantage of the same thermal solution provided for CPU 130. That is, heat sink 350 not only absorbs and dissipates heat from CPU 130, heat sink 350 also absorbs and dissipates heat from the voltage regulator integrated into socket 340.

Figure 4:
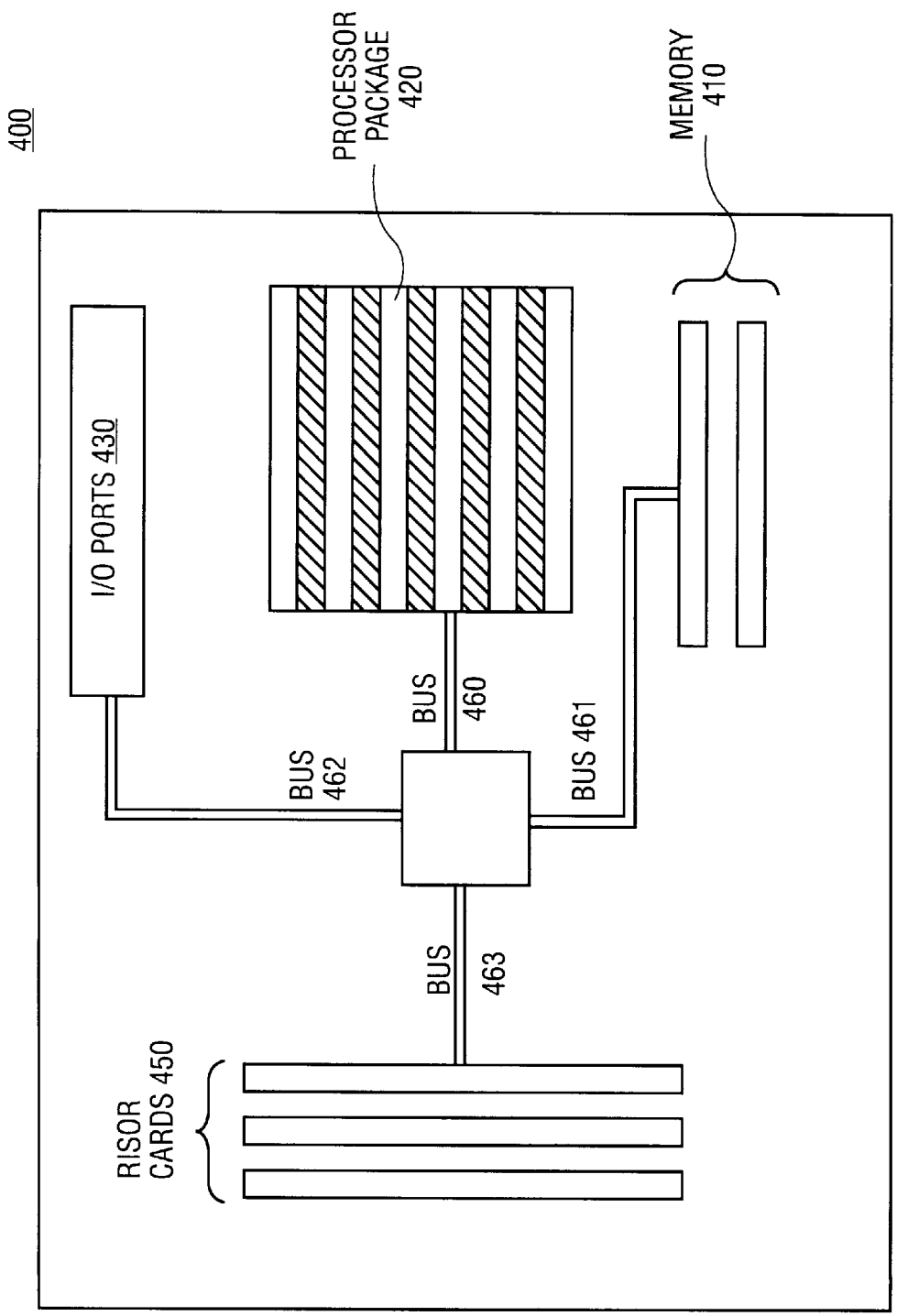
FIG. 4 illustrates one embodiment of a system in which the present invention can be used.

FIG. 4 illustrates one embodiment of a computer system 400 including a processor package 420 according to the teachings of the present invention. Processor package 420 is similar to the embodiment of the present invention illustrated in FIG. 3, and includes a socket having an integrated voltage regulator, a CPU, and a heat sink (all not shown). Bus 460 couples processor package 420 to chip set 470, and from there through buses 461, 462, and 463 to memory 410, I/O ports 430, and riser cards 450.

Computer system 400 is intended to represent a broad category of electronic devices known in the art, such as personal computers, work stations, set-top boxes, internet appliances, etc. Those skilled in the art will recognize that alternate embodiments may not include all of the illustrated components, may combine one or more of the components, may include additional components known in the art, and may be organized in any number of configurations.

Those skilled in the art will also recognize that the present invention is applicable to a wide range of applications and form factors. The present invention could be used for virtually any socketed device that requires high power voltage regulation. For instance, many specialized processors, such as graphics processors, are likely to have similar power and thermal solution requirements that CPUs have. The present invention may also be applicable to sockets for lower power devices, like memory.

Figure 1:
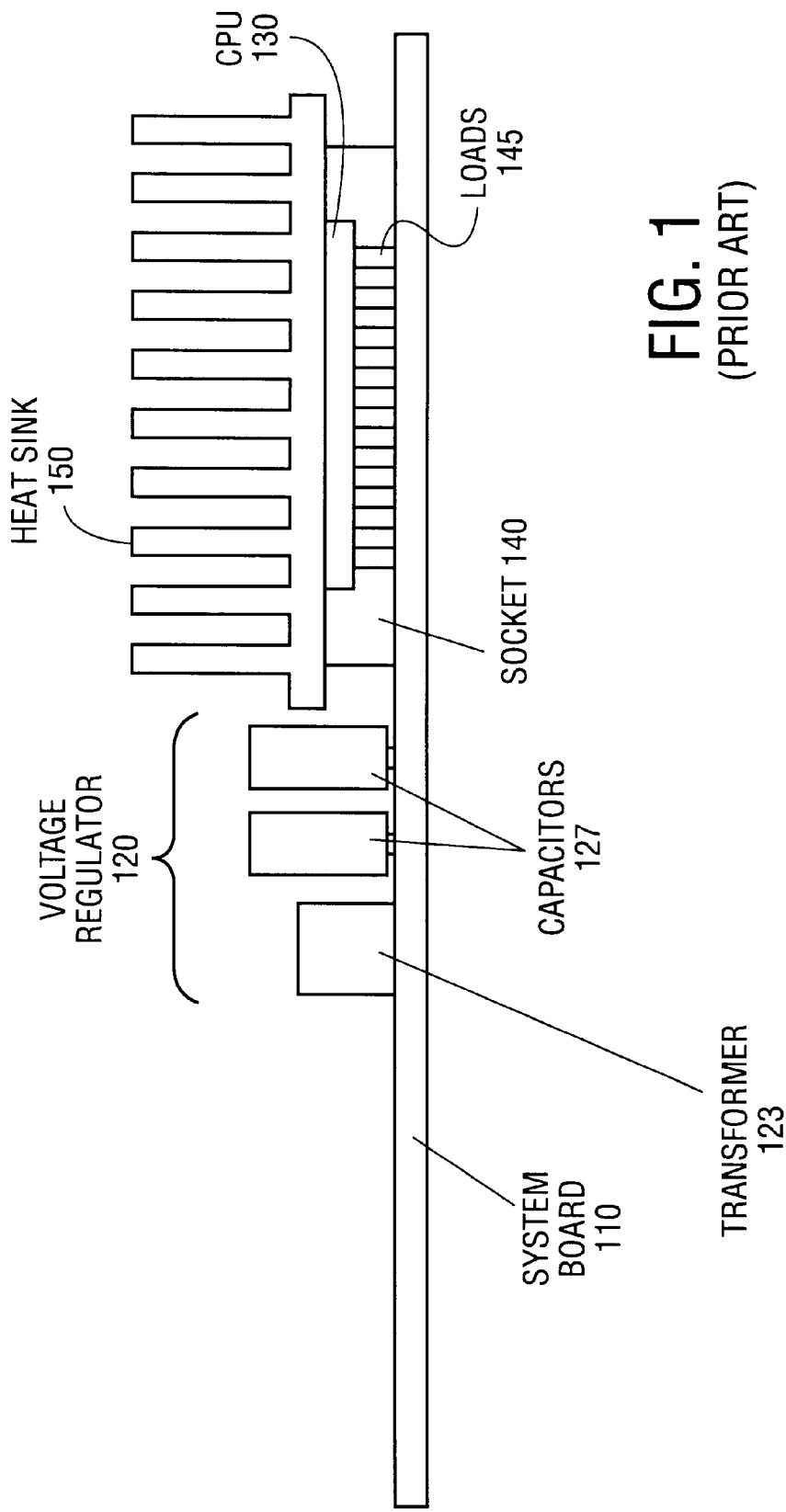
FIG. 1 illustrates a prior art socket configuration.
Figure 5:
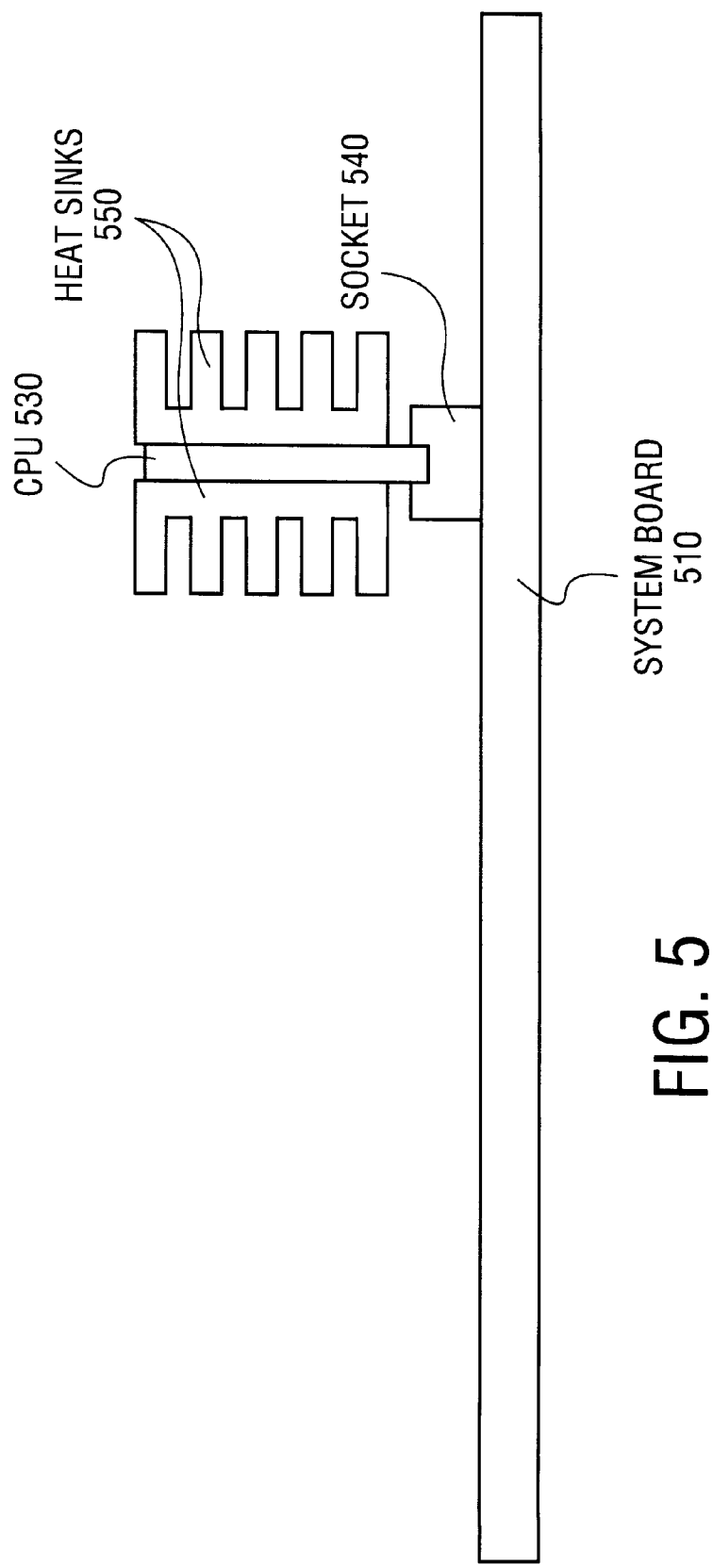
FIG. 5 illustrates another embodiment of the present invention.

The sockets in the embodiments of FIGS. 1–3 are land grid array sockets, which use flexible circuit material to make contact between the ports on the CPU and the leads in the socket. Those skilled in the art will recognize that the invention is similarly applicable to other types of sockets, including pin sockets such as those used for edge mounted devices. FIG. 5 illustrates one embodiment of a pin socket 540 to couple CPU 530 to system board 510. Socket 540 has height limitations much like socket 340 in FIG. 3. That is, the height of the socket is limited by the inductance of leads (not shown) within the socket, as well as by the size and proximity of heat sinks 550 to CPU 530. Socket 540 includes an integrated voltage regulator (not shown) like the integrated voltage regulator 220 in FIG. 2.

Any number of approaches can be used to integrate the voltage regulator into the socket. For instance, the compact components can be mounted onto the same sub-straight used to support the socket leads, and the chassis can be an injection mold used to enclose all of the components.

Thus, an integrated circuit socket having a built-in voltage regulator is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. An apparatus comprising:
    a socket to attach to a first component and including a receptive area to couple a second component to the first component;
    a low profile voltage regulator integrated into the socket and proximately disposed adjacent to the receptive area, said voltage regulator to covert a first power signal from the first component to a second power signal for the second component; and
    a chassis having a first bottom planar surface coupled with a substantially parallel second top planar surface, said second top planar surface to serve as a base for a heat sink to be attached to the second component, wherein the socket and the low voltage regulator are enclosed between said first and second planar surfaces.

2. The apparatus of claim 1 wherein the first component comprises a system board and the second component comprises an integrated circuit.

3. The apparatus of claim 1 wherein the second component comprises one of a central processing unit, a graphics processor, and a memory card.

4. The apparatus of claim 1 further comprising:
    a heat sink to couple to the chassis, said heat sink to absorb and dissipate heat from the second component and the low profile voltage regulator.

5. The apparatus of claim 1 wherein the first power signal is a direct current (DC).

6. The apparatus of claim 1 wherein the socket comprises one of a land grid array socket and a pin socket.

7. The apparatus of claim 1 wherein the low profile voltage regulator is to provide up to 80 watts of power for the second component.

8. The apparatus of claim 1 wherein the socket has a particular size limitation and wherein a plurality of circuit elements comprising the low profile voltage regulator conform to the particular size limitation of the socket.

9. The apparatus of claim 8 wherein the socket comprises a plurality of leads, each of the plurality of leads having a length limited by a critical inductance constraint, and wherein the particular size limitation of the socket depends on the critical inductance constraint.

10. The apparatus of claim 8 wherein the chassis is to couple to a heat sink such that the sink forms a thermal connection with the second component and the voltage regulator, and wherein the particular size limitation of the socket depends in the thermal connection.

11. The apparatus of claim 8 wherein the plurality of circuit components include a plurality of capacitors and/or transforms.

12. A system comprising:
    a bus on a system board;
    a processor;
    a system component to couple to the bus on the system board; a socket to attach to the system board and to couple the processor to the bus, the socket comprising a receptive area for the processor and a low profile voltage regulator integrated into the socket and proximately disposed adjacent to the receptive area, said low profile voltage regulator to covert a first power signal from the system board to a second power signal for the processor; and
    a chassis to enclose the socket and the low profile voltage regulator; said chassis to serve as a base for a heat sink to be attached to the processor.

13. A system comprising:
    a bus on a system board;
    a processor;
    a system component to couple to the bus on the system board;
    a socket to attach to the system board and to couple the processor to the bus, the socket comprising a receptive area for the processor and a low profile voltage regulator integrated into the socket and proximately disposed adjacent to the receptive area, said low profile voltage regulator to convert a first power signal from the system board to a second power signal for the processor; and
    a chassis having a first bottom planar surface coupled with a substantially parallel second top planar surface, said second top planar surface to serve as a base for a heat sink to be attached to the second component, wherein the socket and the low voltage regulator are enclosed between said first and second planar surfaces.

14. A method comprising:
    attaching a socket to a first component, said socket including a receptive area for a second component, a low profile voltage regulator integrated into the socket and proximately disposed adjacent to the receptive area, and a chassis having a first bottom planar surface coupled with a substantially parallel second top planar surface, said second top planar surface to serve as a base for a heat sink to be attached to the second component, wherein the socket and the low voltage regulator are enclosed between said first and second planar surfaces;
    coupling the second component to the receptive area in the socket;
    coverting a first power signal from the first component to a second power signal for the second component using the voltage regulator integrated into the socket; and
    coupling the heat sink to the second top planar surface.

15. The method of claim 14 further comprising:
    absorbing and dissipating heat from the second component and the voltage regulator using the heat sink coupled to the chassis.

16. The apparatus of claim 1 wherein the first power signal is a high frequency alternating current (AC).

* * * * *

UNITED STATES PATENT AND TRADEMARK OFFICE
CERTIFICATE OF CORRECTION

PATENT NO. : 6,359,783 B1
DATED : March 19, 2002
INVENTOR(S) : Noble

It is certified that error appears in the above-identified patent and that said Letters Patent is hereby corrected as shown below:

Column 6,
Line 56, delete "coverting" and insert -- converting --.

Signed and Sealed this

Twenty-seventh Day of August, 2002

Attest:

Attesting Officer

JAMES E. ROGAN
Director of the United States Patent and Trademark Office